United States Patent
Jedinger et al.

(10) Patent No.: US 11,476,745 B2
(45) Date of Patent: Oct. 18, 2022

(54) HOMOPOLAR LINEAR SYNCHRONOUS MACHINE

(71) Applicant: Hyperloop Technologies, Inc., Los Angeles, CA (US)

(72) Inventors: Alexander Jedinger, Long Beach, CA (US); Arbi Gharakhani Siraki, Pasadena, CA (US); Erik Johnson, Los Angeles, CA (US); Shahriyar Beizaee, Woodland Hills, CA (US); Rachel Ozer, Los Angeles, CA (US); Ju Hyung Kim, Los Angeles, CA (US)

(73) Assignee: HYPERLOOP TECHNOLOGIES, INC., Los Angeles, CA (US)

(*) Notice: Subject to any disclaimer, the term of this patent is extended or adjusted under 35 U.S.C. 154(b) by 561 days.

(21) Appl. No.: 16/576,610

(22) Filed: Sep. 19, 2019

(65) Prior Publication Data
US 2020/0088819 A1    Mar. 19, 2020

Related U.S. Application Data

(60) Provisional application No. 62/733,551, filed on Sep. 19, 2018.

(51) Int. Cl.
*H02K 41/03* (2006.01)
*G01R 33/38* (2006.01)
(Continued)

(52) U.S. Cl.
CPC ......... *H02K 41/03* (2013.01); *G01R 33/3856* (2013.01); *H02K 1/20* (2013.01);
(Continued)

(58) Field of Classification Search
CPC ...... H02K 41/03; H02K 41/035; H02K 19/12; H02K 19/103; B61B 13/10; B61B 13/08; B65G 54/02
(Continued)

(56) References Cited

U.S. PATENT DOCUMENTS 3,456,136 A * 7/1969 Pierro .................... H02K 41/03
                                                   318/135
3,585,423 A * 6/1971 Bolton ................. H02K 41/025
                                                   310/13
(Continued)

FOREIGN PATENT DOCUMENTS

DE    102016122612    *  5/2018  ............... H02K 9/22
WO   WO 2008132041 A1 * 11/2008  ............... H02K 1/20

OTHER PUBLICATIONS https://www.theworldmaterial.com/type-304-grade-stainless-steel/ (Year: 2022).*

*Primary Examiner* — Burton S Mullins
(74) *Attorney, Agent, or Firm* — Greenblum & Bernstein, P.L.C.

(57) ABSTRACT

A moving member of a machine can include a cold plate that serves as a primary structural member for the moving member. The cold plate can have one or more cooling channels formed within the cold plate. A plurality of armature windings can be fixed to the cold plate. One or more field windings can be fixed to the cold plate. A plurality of ferromagnetic cores can be fixed to the cold plate, each ferromagnetic core positioned within a loop of at least one of the plurality of armature windings. Other embodiments are described.

16 Claims, 11 Drawing Sheets

(51) Int. Cl.
*B61B 13/08* (2006.01)
*H02K 19/10* (2006.01)
*H02K 9/22* (2006.01)
*H02K 3/24* (2006.01)
*G01R 33/385* (2006.01)
*H02K 1/20* (2006.01)
*H02K 3/22* (2006.01)
*H02K 15/02* (2006.01)
*H02K 3/04* (2006.01)

(52) U.S. Cl.
CPC ............... *H02K 3/04* (2013.01); *H02K 3/22* (2013.01); *H02K 3/24* (2013.01); *H02K 9/22* (2013.01); *H02K 15/02* (2013.01); *H02K 19/10* (2013.01)

(58) Field of Classification Search
USPC .............. 104/285, 290, 292, 294; 310/12.01, 310/12.09, 12.18, 13, 216.023, 266; 318/135
See application file for complete search history.

(56) References Cited

U.S. PATENT DOCUMENTS

| | | | | |
|---|---|---|---|---|
| 3,699,365 A * | 10/1972 | Leitgeb | H02K 41/03 | 310/12.24 |
| 3,842,747 A * | 10/1974 | Schwarzler | B60L 13/003 | 104/130.02 |
| 3,850,108 A * | 11/1974 | Winkle | B60L 13/10 | 104/294 |
| 3,860,839 A * | 1/1975 | Buchberger | H02K 41/03 | 310/12.24 |
| 3,884,154 A * | 5/1975 | Marten | B60L 13/10 | 104/282 |
| 3,890,906 A * | 6/1975 | Maki | B60L 13/10 | 505/905 |
| 3,919,607 A * | 11/1975 | Habock | B60L 13/03 | 318/135 |
| 4,408,145 A * | 10/1983 | Artemenko | H02K 41/02 | 318/135 |
| 4,839,545 A * | 6/1989 | Chitayat | H02K 41/02 | 310/58 |
| 5,249,529 A * | 10/1993 | Herbermann | B60L 13/06 | 104/286 |
| 5,479,145 A * | 12/1995 | Kalsi | B60L 13/10 | 335/297 |
| 6,661,124 B1* | 12/2003 | Seki | H02K 41/031 | 310/58 |
| 6,825,583 B2* | 11/2004 | Joung | H02K 5/203 | 310/16 |
| 9,325,222 B2* | 4/2016 | Shinohira | H02K 9/19 | |
| 10,177,640 B2* | 1/2019 | Achterberg | H02K 41/02 | |
| 10,193,428 B2* | 1/2019 | Kusase | H02K 19/12 | |
| 10,279,441 B2* | 5/2019 | Hanamachi | C23C 24/04 | |
| 10,873,245 B2* | 12/2020 | Fernandes Goncalves | H02K 41/02 | |
| 11,139,721 B2* | 10/2021 | Trolliet | H02K 9/18 | |
| 2003/0141769 A1* | 7/2003 | Kubo | H02K 3/24 | 310/12.22 |
| 2007/0257563 A1* | 11/2007 | Huang | H02K 41/03 | 310/12.25 |
| 2008/0245508 A1* | 10/2008 | Shimura | H02K 41/03 | 165/104.11 |
| 2015/0162812 A1* | 6/2015 | Da Conceicao Rosa | H02K 41/031 | 310/12.29 |
| 2016/0102928 A1* | 4/2016 | Da Conceição Rosa | H02K 41/02 | 165/104.28 |

* cited by examiner

HOMOPOLAR LINEAR SYNCHRONOUS MACHINE

CROSS-REFERENCE TO RELATED APPLICATIONS

This application claims the priority and benefit of U.S. Provisional Application No. 62/733,551 filed on Sep. 19, 2018, the disclosure of which is incorporated herein by reference in its entirety.

TECHNICAL FIELD

The present disclosure relates to the field of electric motors, particularly a homopolar machine for use in linear propulsion systems.

BACKGROUND

A direct drive motor is a type of synchronous motor that directly drives the load, rather than using a transmission or gear box. Linear motors are generally direct drive motors as it is generally not feasible to have any intermediary components. As applications for large scale linear motion increases, direct drive motors have been increasingly explored. The constraints of a high-speed, high-power transportation system impose challenges that are not present in the state of the art. This is especially true in environmentally controlled and evacuated environments, where aero drag no longer constitutes the vast majority of drag present in the system. Instead, the new challenges faced are related to electromagnetic drag due to iron losses, mass efficiency, electrical efficiency, and thermal management. In a transportation system that seeks to promote high-speed, high-efficiency, and high-power density, a novel employment of a homopolar linear synchronous machine offers vast improvements in the state-of-the-art.

BRIEF DESCRIPTION OF THE DRAWINGS

These and other features of this disclosure will be best understood by reference to the following detailed description of embodiment, taken in conjunction with the accompanying drawings, in which.

DETAILED DESCRIPTION

Figure 1:
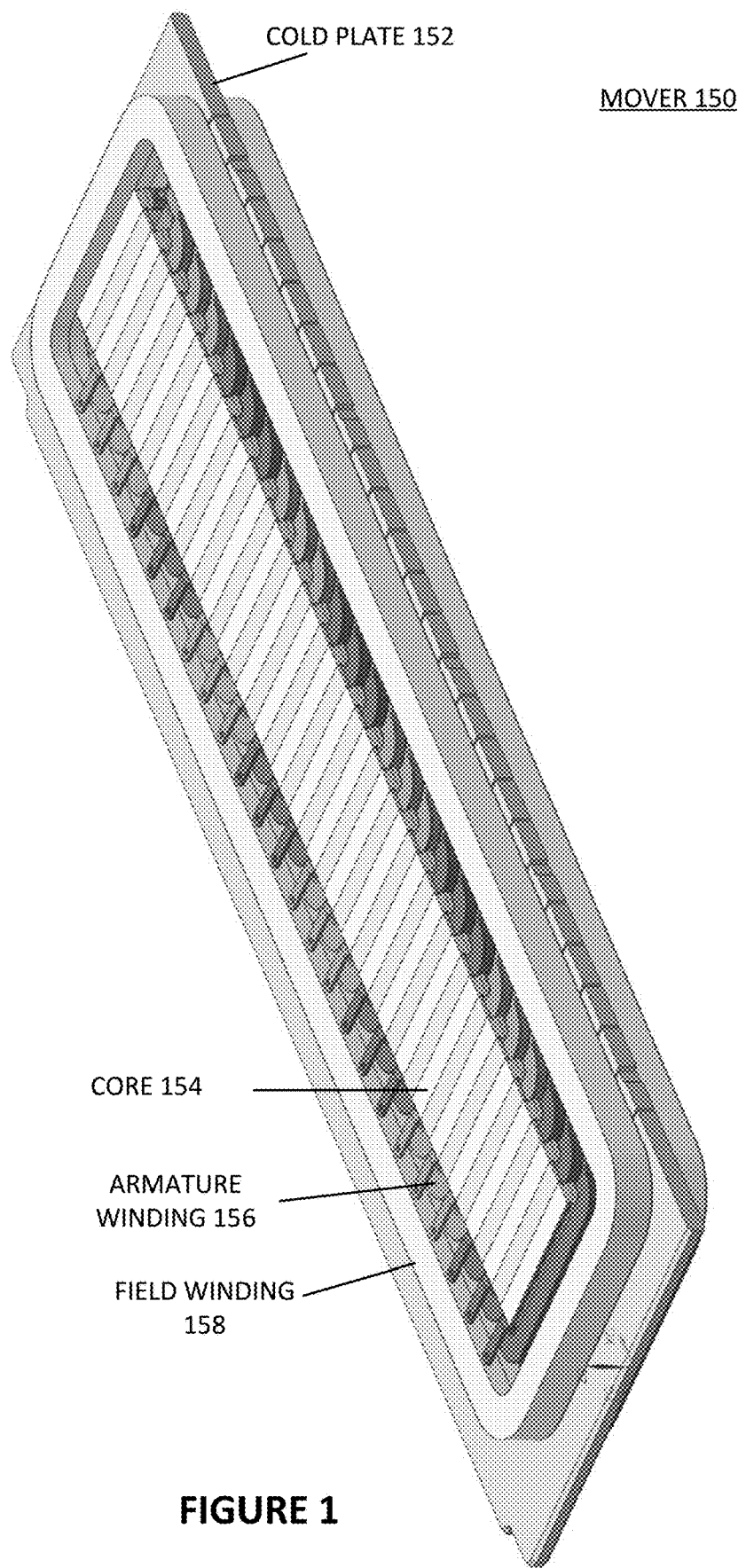
FIG. 1 shows a perspective view of an exemplary embodiment of a mover/rotor that can serve as a moving member of a homopolar linear synchronous machine.

The features which are characteristic of the disclosure, both as to structure and method of operation thereof, together with further objects and advantages thereof, will be understood from the following description, considered in connection with the accompanying drawings. It is to be expressly understood, however, that the drawings are for the purpose of illustration and description only, and they are not intended as a definition of the limits of the disclosure.

The present embodiment relates to a system with a moveable rotor and a relatively fixed stator such that the two together form a homopolar linear synchronous machine. The rotor may include an at least one coil winding, an at least one core, and an at least one cold plate. A core may be constructed from a ferromagnetic material, such as silicon steel. A core may be laminated, such that the core is constructed from at least two sheets of metal that have been joined together. The lamination of the core may be grain oriented and non-grain oriented. A cold plate may include a rectangular sheet of aluminum. The cold plate may have cooling channels for removing heat. The cold plate may also serve as the main structural unit of the rotor. The cold plate may have substantially parallel hollow slots removed from the cold plate. The hollow slots may be rectangular in shape. The core may be joined to the cold plate, such that the core fits substantially within a hollow slot of the cold plate and the core may be substantially connected to the cold plate by any of known means, such as mounting brackets. A portion of the core may extend beyond at least one face of the cold plate, such that when viewed down the length of the cold plate, the core may be visible extending out from at least one side.

A plurality of cores may be joined to the cold plate. In an embodiment, a second core may be attached to a cold plate in a location that is offset from a first core, such that the second core and the first core are substantially parallel. The at least one coil winding may include an armature winding and a field winding, either alone or paired together. The winding may be made from a conductive material, such as anodized aluminum foil. In an embodiment, the rotor may include a field winding that is oriented such that the winding is substantially entirely along the outer perimeter of a face of the cold plate. In an embodiment, the rotor may include an at least one armature winding, wherein the loop formed by the winding has a face that is oriented substantially parallel to a face of the cold plate. The armature winding may be located substantially on an outer face of the core. In an embodiment, the armature winding may include an at least one armature coil. An embodiment may include a rotor with several armature coils on the length of the rotor, wherein each armature coil may represent an electrical phase of multi-phase electrical power.

A core may be located such that it is substantially between a first armature coil and a second armature coil. The armature winding may be substantially enclosed by the field winding, such that the armature winding has a face that is adjacent to a face of the cold plate, within the bounds of the field winding. The field winding may be secured to the cold plate by any of known means, such as stainless steel straps and PTFE brackets.

The stator may include an at least one c-channel segment made of a ferromagnetic material, such as silicon steel. In an embodiment, the c-channel segment may be laminated such that the c-channel segment is constructed from at least two sheets of metal that have been joined together. In an embodiment, the c-channel segment may be substantially "C" shaped, such that the rotor may be able to pass through the center hollow portion of the "C". The stator may include two or more offset c-channel segments, such that there is a gap between each c-channel segment, and the channel segments are arranged substantially with the hollow section of each c-channel segment forming a substantially continuous path for a rotor to move through. The stator may be substantially fixed relative to the rotor.

At least one ripple spring may be used to press the armature windings against the cold plate. In an embodiment, the end windings are in contact with the cold plate to maximize surface area of windings that are exposed to the cold plate. The armature windings may be configured as fractional slot concentrated windings, with alternating windings distributed throughout the ferromagnetic core located along a length of the rotor.

In one embodiment, the armature coils when viewed from cross-section may be arranged in layers, such that all armature coils of the same phase may be the same distance from a core face, and armature coils of different phases may be different distances from a core face. A portion of a first armature coil in a first layer may overlap a portion of a second armature coil that is in a second layer. Such an embodiment may have a short pole pitch as a result.

The propulsion of the rotor along a stator track may incorporate wireless charging. The use of electromagnetic fields allows for an easy transition into inductor-based charging, allowing a vehicle or other battery to charge as the rotor moves along the stator. In an embodiment, charging may be accomplished by having windings located on the track.

The distinct coil windings may be powered by multiple power sources, such as low power drives, rather than a conventional high power drive supplying power to an entire propulsion system. Each low power drive may be connected to one or more pole pairs.

In one embodiment, the cold plate may be laminated to reduce eddy currents. The cold plate may take on a design such as a "teethed" geometry, with gaps across the cold plate. The cold plate may be made of a cooling metal with favorable thermal properties such as aluminum, magnesium, and stainless steel. The armature coils and field coils may be substantially in contact with the cold plate, such that heat is transferred out of the armature coils and field coils and into the cold plate. In an embodiment, the cold plate may have an at least one cooling channel on a face. Cooling channels may be removed from a block, such as through gun drilling, and designed into adjoining faces of separate plates that are substantially attached, such as through vacuum brazing.

A high speed transportation system may include a homopolar linear synchronous machine. The rotor may be substantially attached to a payload, such as by including bolt holes in the cold plate that may be connected to the payload. The payload may be a vehicle, such as for cargo and passengers. An embodiment can use conductive shielding on the rotor to avoid plasma generation. The rotor may be attached to the payload in any of one or more orientations, such as on the top, bottom, and side of the payload, so long as a corresponding stator segment is substantially connected to a surface in an orientation that allows the rotor to pass through a channel segment in the direction of motion. The stator may be attached to a fixed surface, such as the inside of a tube. The stator may be substantially fixed in any orientation, so long as the rotor has a substantially matching orientation to allow the rotor to pass through the channel segment. In an embodiment, the high speed transportation system may be enclosed such that the travelling path may be partially evacuated.

An embodiment is directed toward a process for using the homopolar linear synchronous machine as a propulsion system for a high-speed transport system in a low-pressure environment. The rotor may be substantially attached to a payload, such as by including bolt holes in the cold plate that may be connected to the payload. The payload may be a vehicle, such as for cargo and passengers. An embodiment can use conductive shielding on the rotor to avoid plasma generation. The rotor may be attached to the payload in any of one or more orientations, such as on the top, bottom, and side of the payload, so long as a corresponding stator segment is substantially connected to a surface in an orientation that allows the rotor to pass through a channel segment in the direction of motion. The stator may be attached to a fixed surface, such as the inside of a tube. The stator may be substantially fixed in any orientation, so long as the rotor has a substantially matching orientation to allow the rotor to pass through the channel segment. Power may be passed to the windings on the rotor, introducing a magnetomotive force. The varying magnetic flux comes from the saliency of the channel segments relative to the field winding, introducing a field flux path that closes substantially perpendicular to the direction of motion. Thrust may be generated by the interaction between the field flux and the current in the armature coils.

As described, the cold plate serves multiple purposes, for example, absorbing thermal energy from field coils, armature coils, and ferromagnetic cores, while also serving as the main or primary structural member of the rotor/mover. In one embodiment, FIG. 1 shows a mover/rotor 150 that can serve as a moving member of a homopolar linear synchronous machine. The mover includes a cold plate 152 having one or more cooling channels formed within the cold plate (see, for example, cooling channel 172 and 192 of FIG. 6). A plurality of armature windings 156 are fixed to the cold plate. Similarly, one or more field windings 158 are fixed to the cold plate. Although the opposite face of the cold plate is not visible in FIG. 1, it should be understood that the opposite face can also have the same configuration, e.g., cores 154, armature windings 156, and field windings 158. The cores 154 pass through slots of the cold plate, thus each core is shared between both faces. The bottom face of the cooling plate (not shown), however, can have additional armature windings and field windings attached. Thus, it should be understood that the features mentioned for one of the field winding and armature windings on one face of the cold plate can also be applicable to the field winding and armature windings on the opposing face of the cold plate.

In one embodiment, a plurality of ferromagnetic cores 154 are fixed to the cold plate, each ferromagnetic core positioned within a loop or boundary formed from at least one of the plurality of armature windings. Similarly, the plurality of armature windings and the plurality of ferromagnetic cores can be fixed to the cold plate within the outer perimeter of the cold plate, e.g., within boundary formed by field winding 158. Each field winding can be oriented substantially along an outer perimeter (see, for example, outer perimeter 180 shown in FIG. 5) of a face of the cold plate, secured by known means such as a strap, PTFE bracket, or other combination of connecting and fastening members.

The cold plate serves as the primary structural member of the mover, for example, by providing sufficient strength and stiffness, to maintain the positions and orientations of the armature windings, field windings, and cores. Such structure is especially needed, for example, when the moving member is propelled by magnetic force generated by the armature windings and the one or more field windings, when electrical current passes through them. The cold plate can be a single structure that the other components (the coils and the cores) can affix/mount to. In one embodiment, no additional structural members, other than the cooling plate, are connected between the plurality of armature windings, the plurality of ferromagnetic cores, and the one or more field windings. In one embodiment, the mover has only a single cold plate. Although one payload may attach to a plurality of movers, each mover can have a single cold plate onto which the core and windings are attached.

As described, the components are fixed to the core at designated positions and orientations. The body of the cold plate is sufficiently stiff, strong, and durable to maintain relative positions and orientations of each component while simultaneously absorbing thermal energy from the components. Such positions and orientations are can determine alignment of magnetic fields generated by the windings. Those magnetic fields, in turn, generate the propulsion force of the machine and propel the mover (e.g., through the stator). Thus, it is critical that the positions and orientations of the components be maintained under different load conditions.

Figures 2, 3:
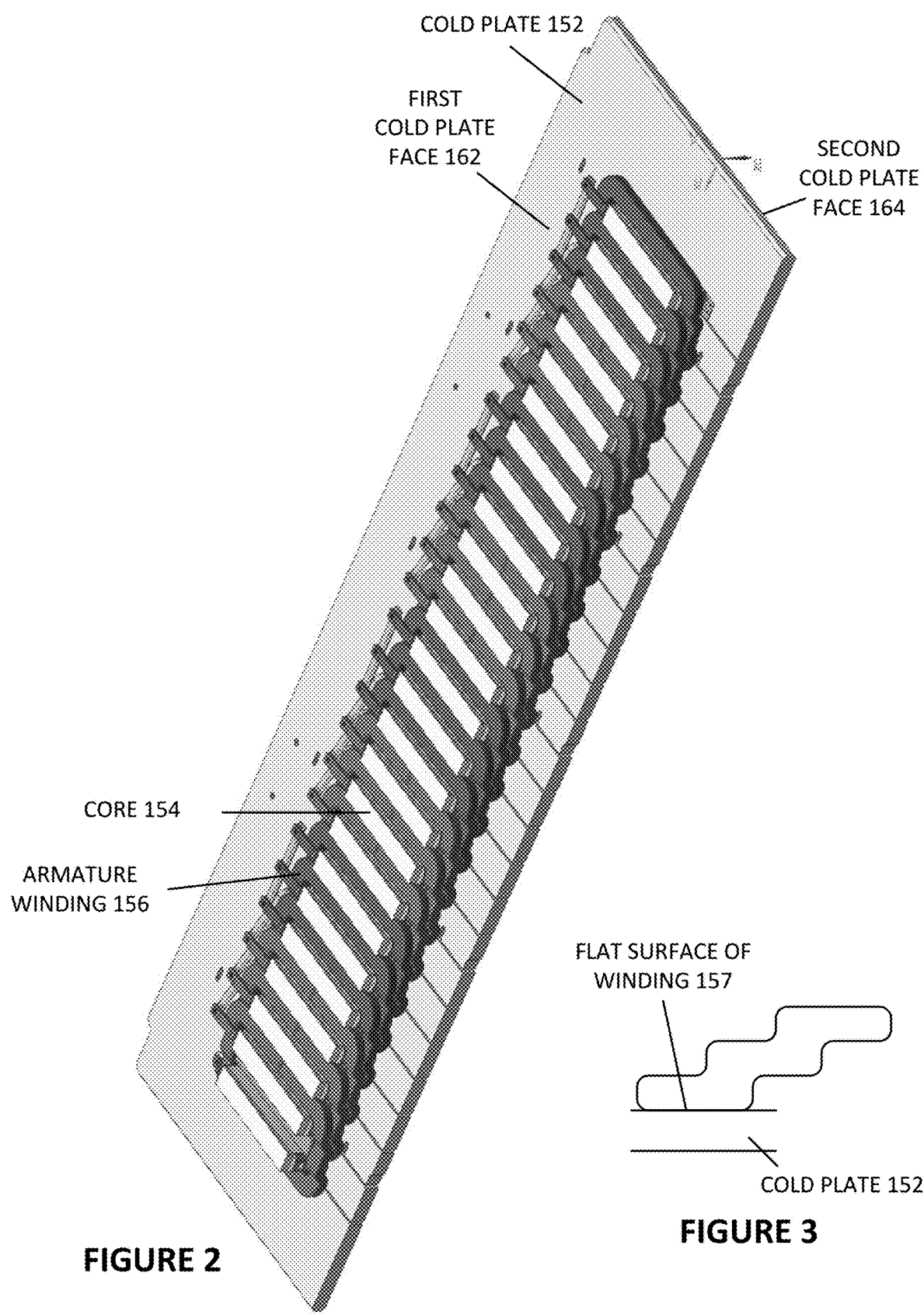
FIG. 2 shows a perspective view of a substantially flat rectangular shape of a cold plate with cold plate faces on opposite sides of the cold plate and armature windings of a motor in accordance with one embodiment.
FIG. 3 shows armature windings with a flat surface that mates with a cold plate in accordance with one embodiment.

The cold plate synergistically provides both cooling and structural integrity. This feature saves on design cost and reduces complexity—additional structural parts, such as skeleton brackets, housings, etc., can be reduced and/or obviated. Further, a separate cooling structure does not have to be developed because the cooling is integrated as the primary structural element onto which the coils and cores are affixed to. Referring to FIG. 2, the cold plate 152 can have a substantially flat rectangular shape with a first cold plate face 162 and a second cold plate face 164 on the opposite side of the first cold plate. It should be understood that FIG. 2 does not show the field windings to provide a less obstructed view of the cores and armature windings and cold plate. In one embodiment, the armature windings and one field winding are mounted to each surface, e.g., one field winding can be mounted to the first face 162 while a second field winding is mounted to the second face 164.

In one embodiment, the plurality of armature coils and the one or more field windings each have at least one flat section that is in contact with the cold plate. For example, referring to FIG. 1, an underside of field winding 158 that is in contact with cold plate 152, although not visible in the drawing, can be flat. The flat surface of the windings can provide sufficient surface area allowing transfer of thermal energy from the field winding to the cold plate. Similarly, as shown in FIG. 3, the armature winding can have a flat surface 157 that mates with the cold plate 152.

Figure 8:
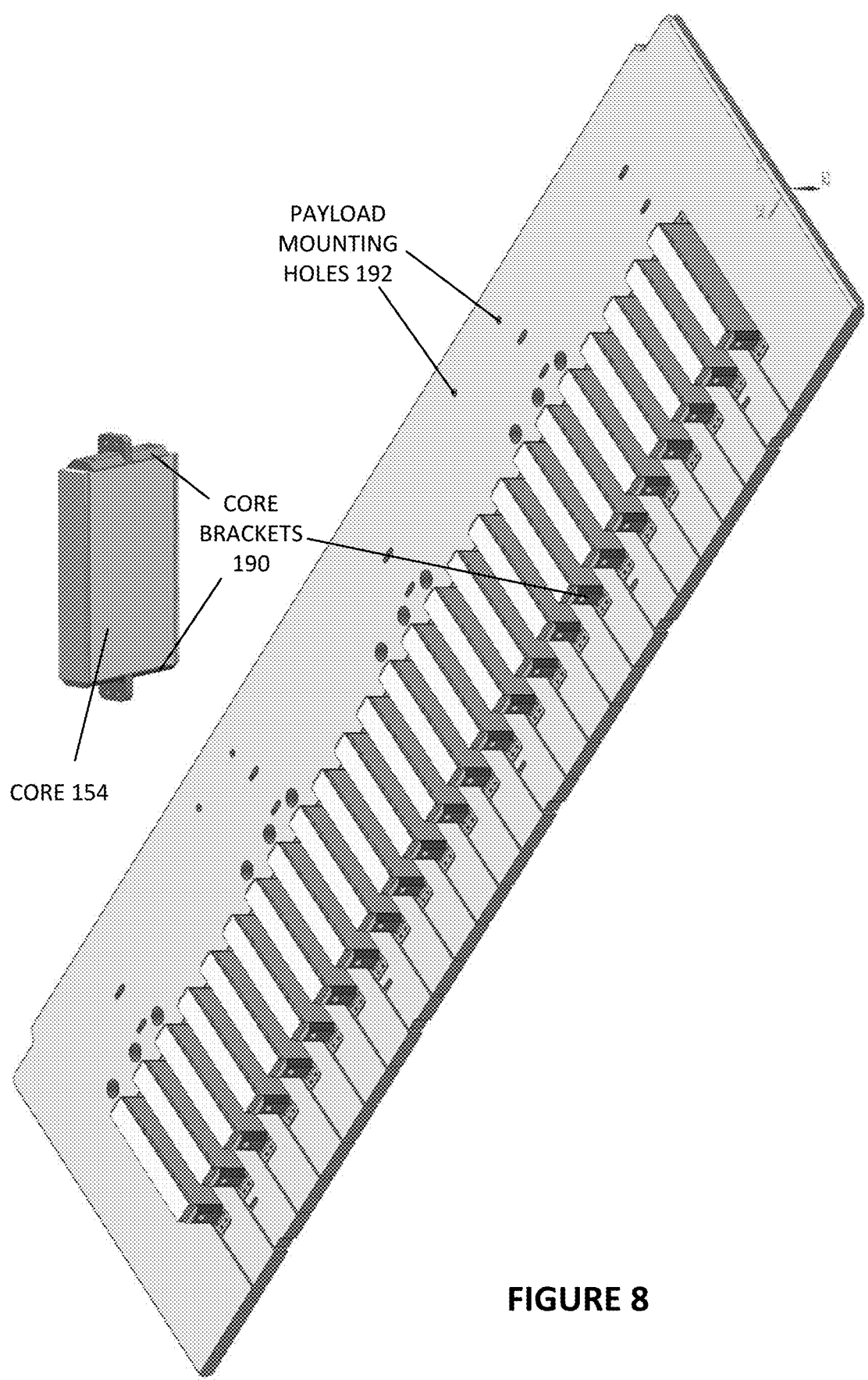
FIG. 8 shows mounting brackets used to affix cores to a cold plate through core mounting holes so that the cores protrude through slots in the cold plate in accordance with one embodiment.

The payload (e.g., a vehicle) can be attached to the cold plate. Referring to FIG. 8, the cold plate can have bolt holes 192 such that a fastener (e.g., a bolt) can connect the cold plate (and consequently, the rest of the mover) to the payload. It should be understood that any combination of connecting hardware such as bolts, brackets, hooks, clamps, etc., can be used to fasten the payload to the cold plate, including fastening hardware that does not require holes. Once attached, as magnetic forces propel the mover through the stator, the connected payload is also propelled. Thus, the cold plate further serves as the primary structural member that transfers mechanical force from the moving member to the payload. This further reduces complexity and risk of failing parts by simplifying the transfer of force (through a single plate) while reducing the need for additional structural and connecting members. Manufacturing and assembly of the machine is also stream lined.

Figure 4:
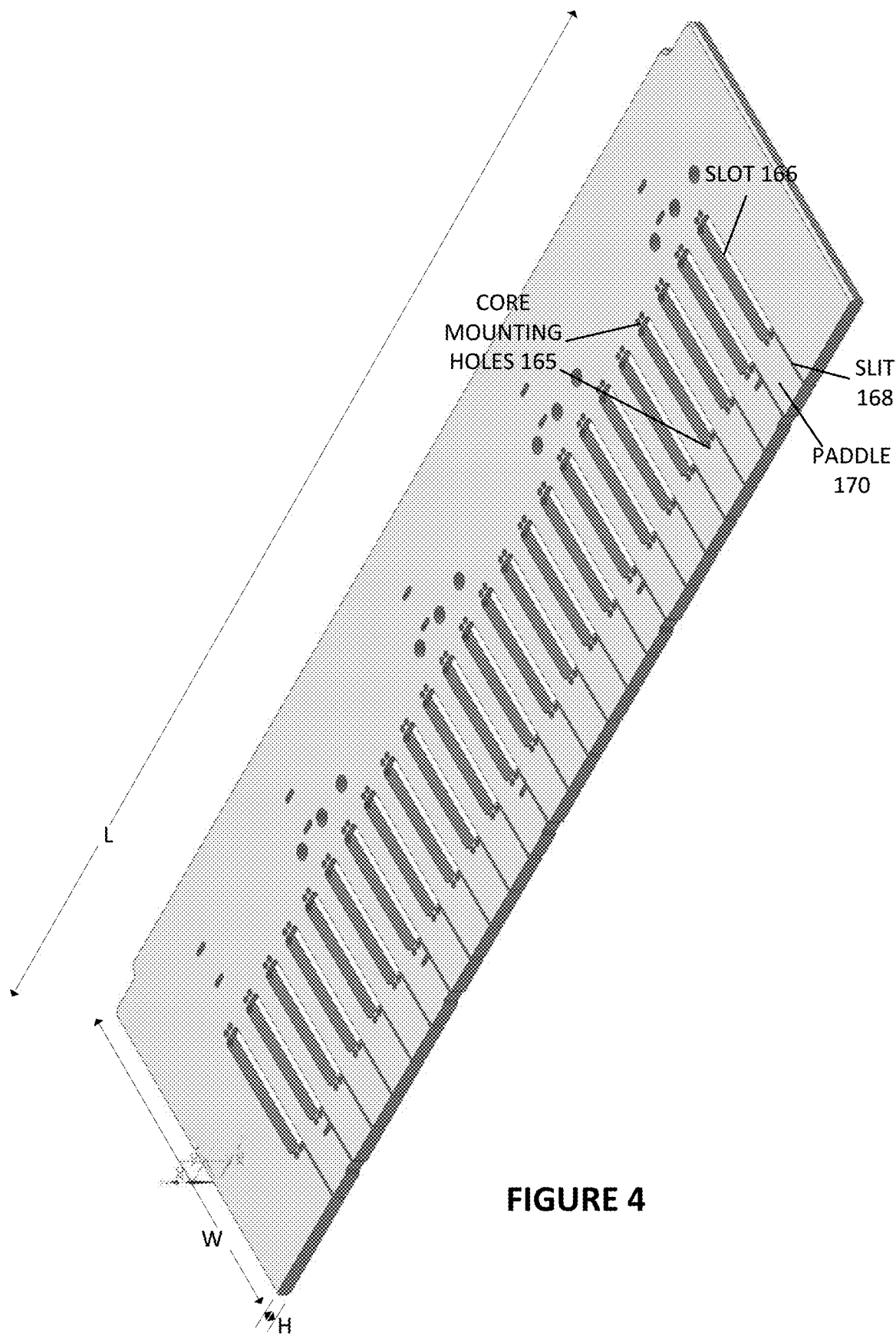
FIG. 4 shows a perspective view of a cold plate with core mounting holes and eddy current slits in accordance with one embodiment.
Figure 5:
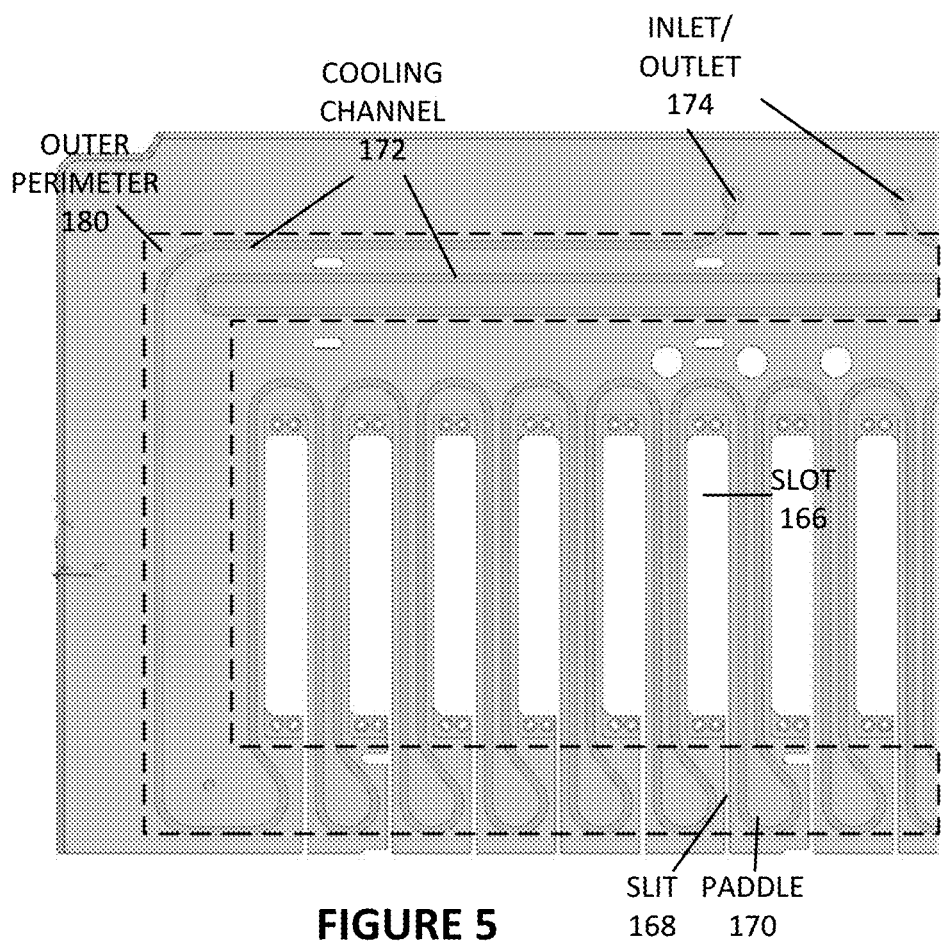
FIG. 5 shows a top view of a cold plate with slots for mounting cores, eddy current slits, and cooling channels in accordance with one embodiment.

As discussed, the cold plate can have slots and each core can fit in a respective slot. These slots can be rectangular in shape. For example, FIG. 5 shows slots 166, each having a rectangular shape, and each being parallel to each other. In one embodiment, the slots can be sized and shaped to house the ferromagnetic cores. Thus, the cross-sectional shape and size of the ferromagnetic cores are similar to (but slightly smaller than) the shape of the slots. Each core can be arranged within a respective slot of the cold plate, and fixed into position. In one embodiment, each of the cores can be aligned parallel to each other. FIG. 8 shows mounting brackets 190 can be fixed to each core 154 (e.g., by known fastening means such as gluing, bolts, screws, etc.). The mounting brackets can mount to holes in the cold plate (e.g., core mounting holes 165 as shown in FIG. 4) thereby attaching the core to the cold plate.

Figure 7:
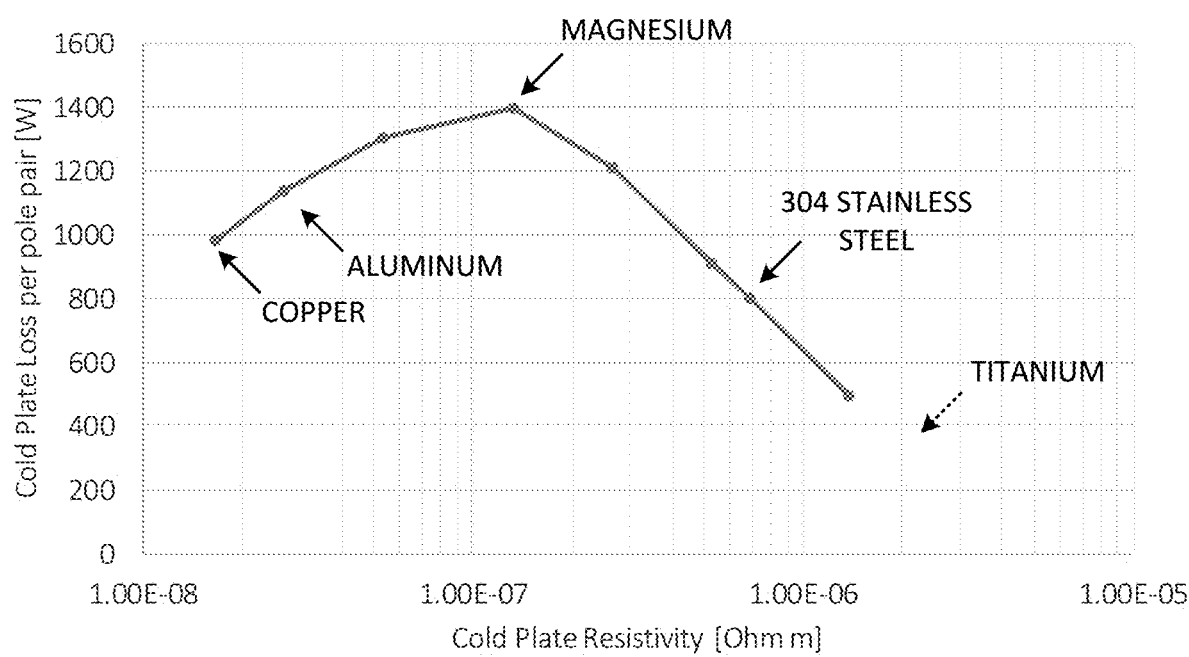
FIG. 7 shows a plot of the power loss in the cold plate for one pole pair due to eddy current for resistivity properties of different materials of the cold plate in accordance with one embodiment.

The cold plate can be formed from a material (e.g., a metal) with favorable thermal conductivity properties. It is appreciated, however, that eddy currents develop at the cold plate due to the magnetic fields generated by the coils. Eddy currents can cause resistive losses. Thus, the resistance of the cold plate material is also a consideration, since higher electrical resistance lowers eddy currents. In one embodiment, the cold plate can include or be formed from aluminum, magnesium, stainless steel, titanium, or another material with suitable thermal conductivity and electrical resistance. In one embodiment, the cold plate can be formed entirely from 304 stainless steel, to minimize electrical conductivity while maintaining sufficient thermal conductivity. Referring now to FIG. 7, although stainless steel does not have the highest thermal conductivity, the resistivity there is sufficiently high to reduce cold plate loss to approximately 800 Watts per pole pair. Cold plates formed from materials such as copper, aluminum, and magnesium have been shown to result in higher losses.

In one embodiment, the cold plate has a substantially flat shape. Referring to FIG. 4, in one embodiment, the plate has a flat rectangular shape. Although the shape can vary, the flat rectangular shape can be used so that the mover can fit within and move through the c-channel segments of the stator. It should be understood that dimensions of the cold plate and mover can vary based on application (e.g., size of intended payload, max intended speed, etc.).

Referring to FIG. 5, the cold plate can have one or more cooling channels 172 formed within the cooling plate. Coolant (e.g., water or other known fluid) can be circulated through the cooling plate to absorb thermal energy. In this manner, thermal energy is transferred from the coils and core affixed to the cooling plate, to the cooling plate, and then to the coolant, to suppress temperatures of the machine from reaching inoperable conditions, resulting in performance degradation and/or equipment damage. Each of the one or more cooling channels can have at least one inlet 174 and one at least outlet 174 where the coolant can be circulated from one or more known circulation means (e.g., a pump). A chiller and/or pump can be integrated as part of the machine, or separate (e.g., attached to the payload). The chiller can be used to cool the coolant while the pump can be used to circulate the coolant, which can be water or other known coolant. The chiller can use known refrigeration systems.

In one embodiment, the cooling channel can have a zig-zagging back and forth pattern, traveling from a first edge of the cold plate towards a second edge of the cold plate, then back towards the first edge, and so on, located near and/or beneath regions where the coils and the cores are located. In one embodiment, the one or more cooling channels form a loop around at least three sides of each of the rectangular slots, as shown FIG. 5. In this manner, coolant in the cooling channel can absorb thermal energy from the core and armature windings positioned at the slot.

As mentioned, the cold plate can have slits 168 formed in the cold plate. For example, as shown in FIG. 5, a slit 168 can be formed from an edge of the cold plate to each slot 166. Each slit can cut through from one face of the cold plate to the other face of the cold plate forming a paddle portion 170 between each slot and the edge. This can reduce eddy currents of the cooling plate, by restricting potential eddy current paths. In such a case, cooling channels can run up a first side of the slot, around the top of the slot, then back down a second side of the slot (forming a loop around the slot), then loop around the paddle section 170, and then continue to a first side of an adjacent slot, and so on, until the slots (e.g., all the slots) have surrounding cooling channels and all the paddle sections have cooling channels that run through them. The cooling channels in the paddle sections can help absorb heat from the core, and armature windings, as well as the field winding, which, in one embodiment, rests on the outer perimeter of the cold plate.

Figure 6:
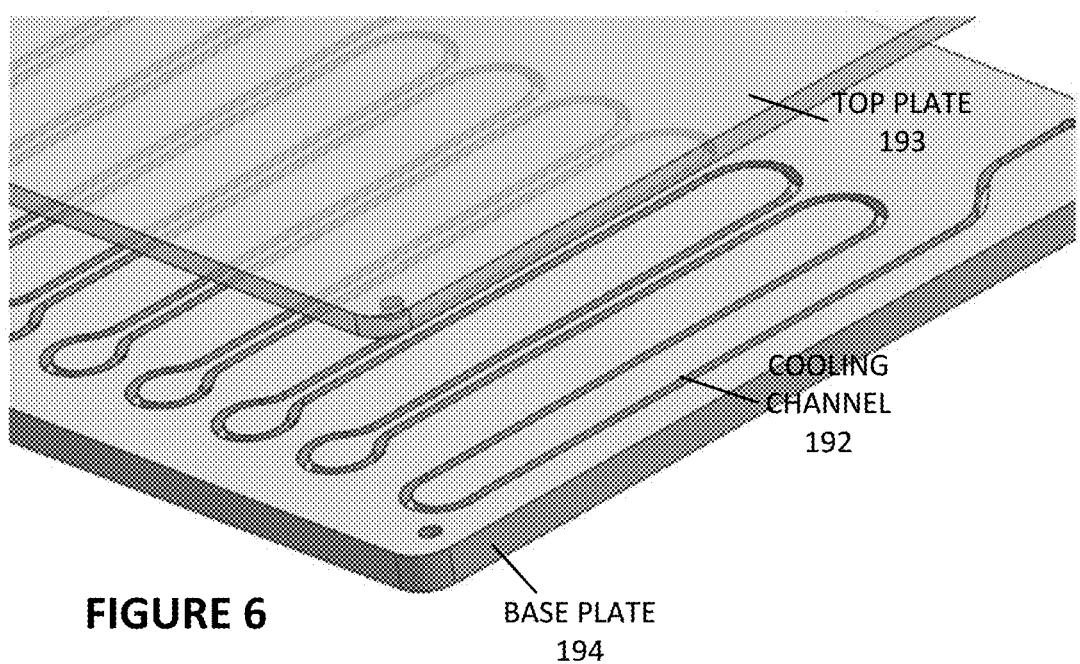
FIG. 6 shows a perspective view of a base plate and a top plate of a cold plate in accordance with one embodiment.

In one embodiment, a process for manufacturing a homopolar linear synchronous machine having a primary structural member on which one or more field windings and one or more armature windings are affixed to, is described. Referring to FIG. 6, the process can include forming a base plate 194 and a top plate 193, each having a flat rectangular cube shape. In one embodiment, the one or more cooling channels 192 are formed in the base plate, for example, through machining grooved paths on a surface of the base plate to form the channels).

In one embodiment, flatten annealing can be applied to the plates to reduce warping and improve braze quality. The base plate and the top plate can be brazed together (e.g., through vacuum brazing), thus forming a single cold plate with internal cooling channels. Referring to FIG. 5, the eddy current slits 168 and the slots 166 can be machined from the top and base plates prior to brazing the plates together or after the plates are brazed together. Similarly, other details such as holes or grooves can be machined into the cold plate either before or after brazing.

In one embodiment, the process can include stress relieving the plates, prior to or after brazing, to minimize warping during machining, e.g., heat treating the steel to a temperature below a critical threshold to relieve residual stress that could result from cutting, rolling, or shearing of the steel.

In one embodiment, the process includes fixing a plurality of cores, a plurality of armature windings, and one or more field windings to the cold plate, as described in other sections.

Figure 9:
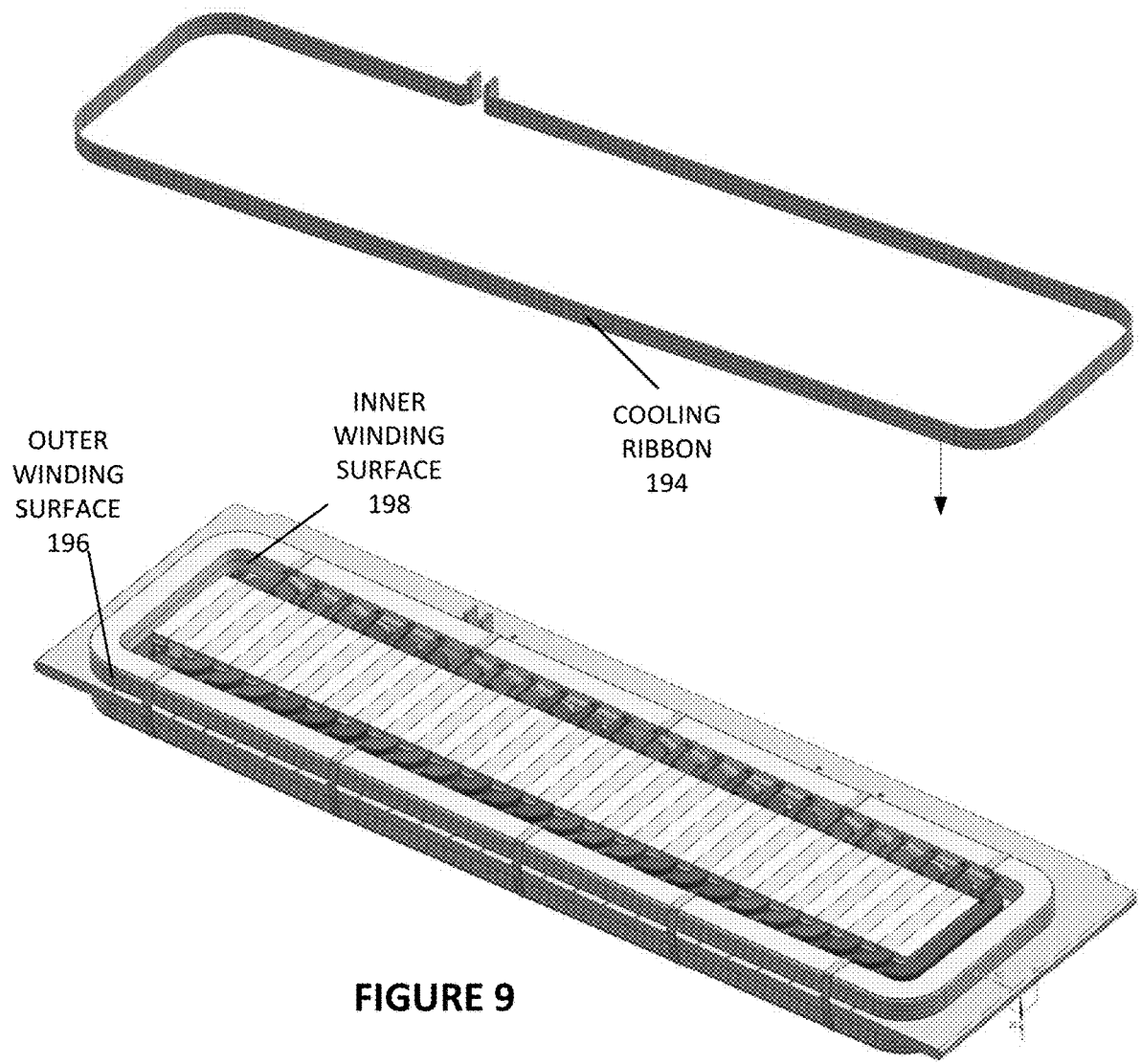
FIG. 9 shows a mover that incorporates one or more cooling ribbons for field windings of a motor on a cold plate in accordance with one embodiment.

FIG. 9 shows a mover that incorporates one or more cooling ribbons, according to one embodiment. A cooling ribbon 194 can have internal channels for circulating coolant. The ribbon can connect and attach to a length of the field winding to further absorb thermal energy from the field winding (in addition to the cold plate). For example, the cooling ribbon can connect and attach to an outer surface 196. Additionally, or alternatively, another cooling ribbon can connect and attach to an inner surface 198 of the field winding.

As discussed, the cores of the rotor may be fixed to the cold plate so the cores, also referred to as teeth, protrude through the slots in the cold plate, as shown in FIG. 8. The cores provide the paths through which the magnetic flux of the armature windings and the field windings may flow. Because the mover on which the rotor is situated does not need to provide axial flux paths (e.g., in the longitudinal x-direction through the mover), the mover may optimize for flux paths in the vertical direction (e.g., in the z-direction through the air gap of the track). The slots that are cut through the mover and the cold plate, and the parallel cores protruding through the slots provide one embodiment of a yoke-less mover. Compared to a conventional yoke that provides a continuous axial flux path, the yoke-less mover has better ferromagnetic utilization and lower weight. It also enables more flexible topologies in the armature windings. In one embodiment, the active weight of the iron and copper of the mover may be reduced by 25% while maintaining the same thrust.

Figure 10:
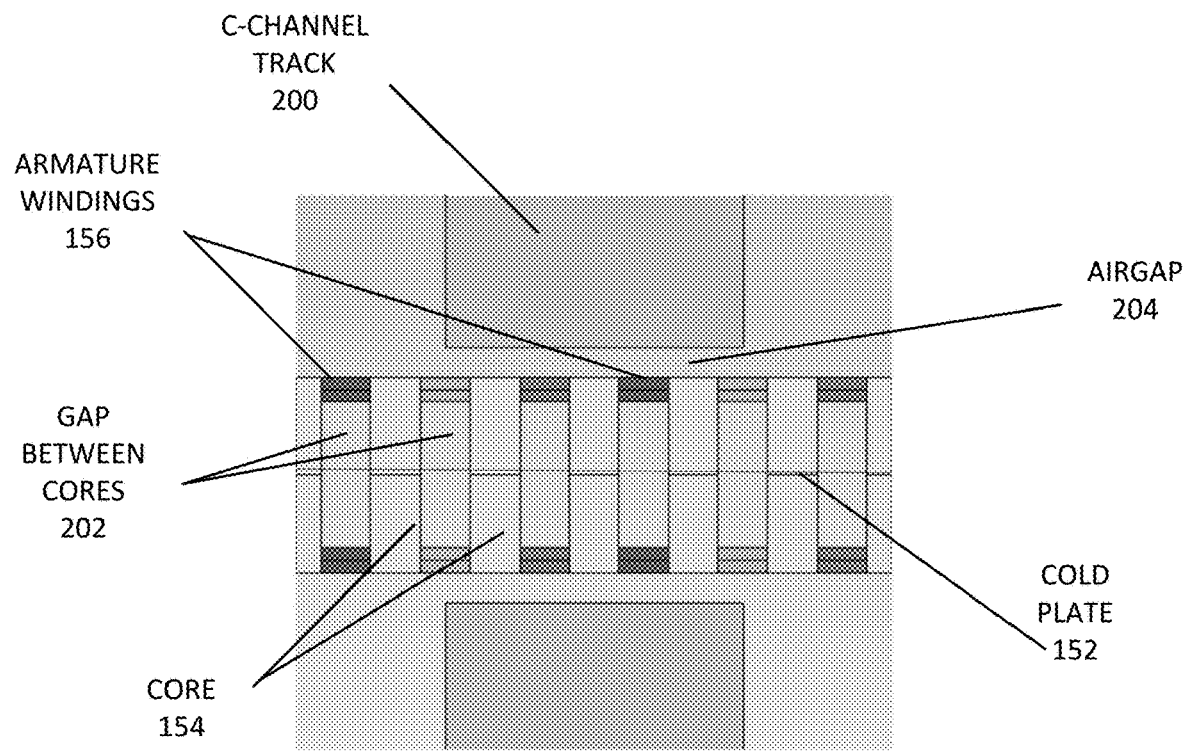
FIG. 10 shows a cross-sectional view of a yoke-less mover with armature windings in the longitudinal x-direction (e.g., direction of movement of the mover) and in the vertical z-direction in accordance with one embodiment.

FIG. 10 shows a cross-sectional view of a mover in the longitudinal x-direction (e.g., direction of movement of the mover) and in the vertical z-direction. The mover has parallel cores 154 protruding in the z-direction on both sides of the cold plate 152 through their respective slots in the cold plate 152. A core does not run continuously in the longitudinal x-direction on either surface of the cold plate 152. Instead, gaps 202 are created in the mover in the spacing between the cores 154. The gaps 202 between the cores 154 provide the space for the armature winding. In one embodiment of the topology of the armature windings 156, each phase of the three-phase armature windings occupies consecutive gaps 202. A coil of an armature winding may thus occupy gaps 202 that are separated by three cores 154 on either side of the cold plate 152. The distance between the coils of the armature windings 156 of each phase extending in the x-direction may be referred to as the pole pitch. The mover may slice through the gap in the c-channel track 200 along the x-direction. Magnetic flux generated by the pole pair of the armature winding 156 may flow through the cores 154 and an air gap 204 between the mover and the c-channel track 200. In one embodiment, the air gap 204 may be 15 mm. The c-channel track 200 may be referred to as a slot, and the width of the c-channel track 200 may be referred to as the slot width. FIG. 10 shows one embodiment of a motor in which the pole pitch is twice the slot width. Other ratios of the pole pitch and slot width are possible.

Figure 11:
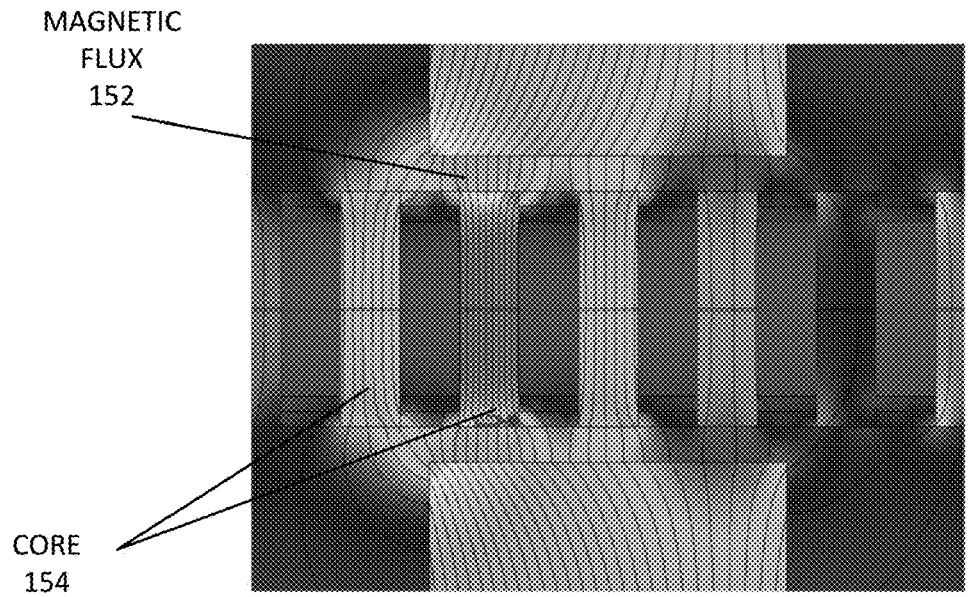
FIG. 11 shows the flow of magnetic flux through the cores and through air gaps between a yoke-less mover and a track in accordance with one embodiment.

FIG. 11 shows the flow of the magnetic flux 152 through the cores 154 and the air gap 204. Because the teeth of the cores 154 optimize the flow of the magnetic flux in the z-direction, the magnetic flux density through the cores are higher compared to a conventional yoke rotor, enabling better ferromagnetic utilization while reducing the weight of the mover.

In one embodiment, the cores 154 may be constructed from a ferromagnetic material, such as silicon steel. The cores 154 may be laminated, for example, using M19 silicon steel laminated with C5 coating for lamination insulation. To manufacture the laminated cores, a stamp lamination process may be used to bond the silicon steel into bonded lamination stacks of the motor teeth. In one embodiment, cobalt iron may be used instead of silicon steel to improve the force output or efficiency.

Figure 12:
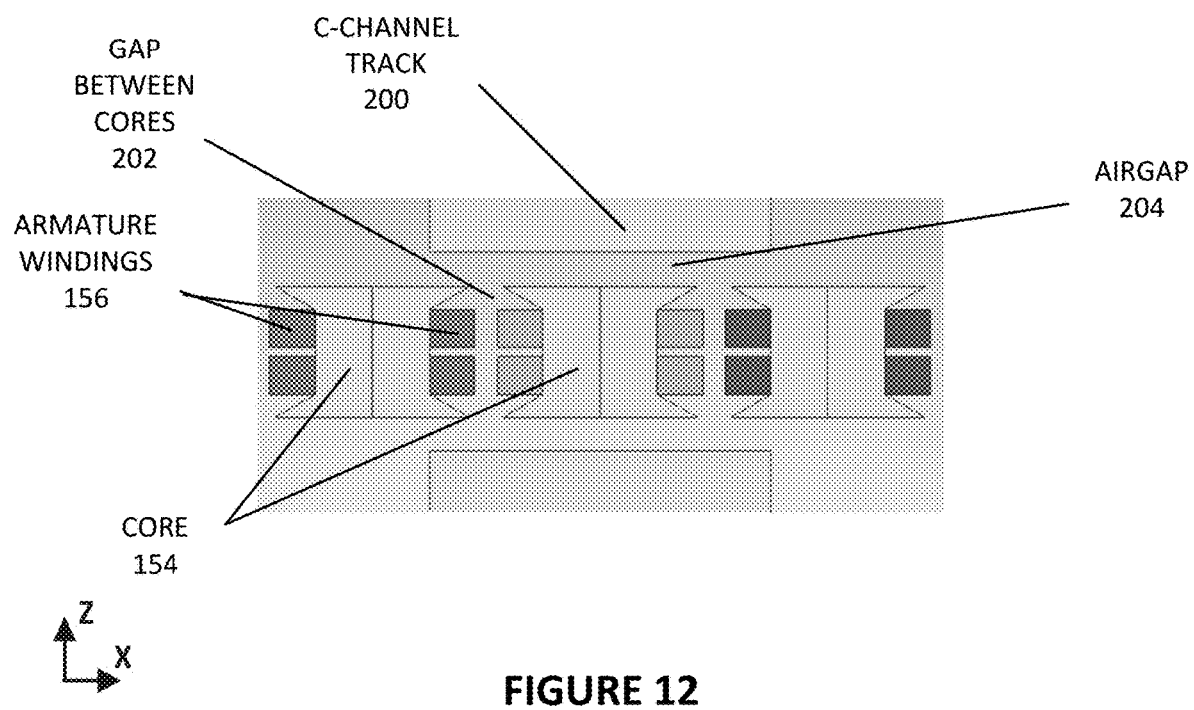
FIG. 12 shows a cross-sectional view of fractional slot concentrated windings (FSCW) in the longitudinal x-direction and in the vertical z-direction of a yoke-less mover as one example topology of armature windings of a yoke-less mover in accordance with one embodiment.
Figure 13:
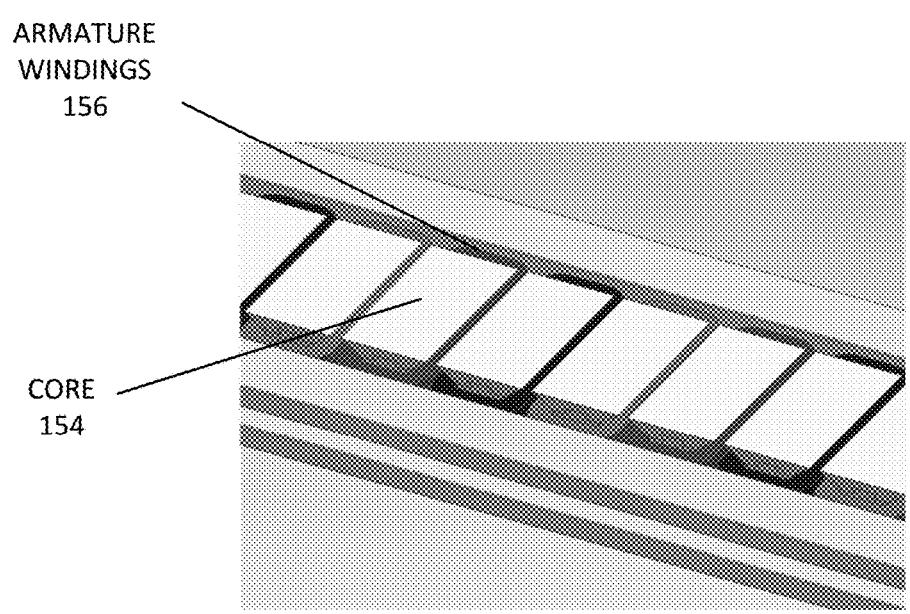
FIG. 13 shows a perspective view of the FSCW of the armature windings and cores of a yoke-less mover in accordance with one embodiment.

The cores 154, also called motor teeth, of the yoke-less mover, may accommodate various topologies of the armature windings of the rotor. FIG. 12 shows a cross-sectional view of fractional slot concentrated windings (FSCW) in the longitudinal x-direction and in the vertical z-direction. The cold plate is not shown, but it is understood that the cores 154 may protrude through their respective slots in the cold plate and the mover. The coil of a phase of the armature windings 156 may be wound around each of the cores 154 to create a pole. The three phases of the armature windings 156 may be positioned in three consecutive cores 154 and the pattern repeated along the cores 154 of the motor in the x-direction. In one embodiment, there may be 25 cores 154 on a motor to accommodate 24 coils of the armature windings 156 on each side of the cold plate. The 24 armature coils may be divided into four pole pairs. The 6 armature coils of each pole pair may include a pair of armature coils for each pole pair for each of the three phases. The FSCW may be called as such because the pole pitch of the armature windings 156 is less than or a fraction of the width of the c-channel track 200 or the slot width. FIG. 12 shows one embodiment of the FSCW in which the pole pitch is 0.5 of the slot width. FIG. 13 shows a perspective view of the FSCW of the armature windings 156 and the cores 154 from above the motor along the x-direction.

The advantages of the FSCW in rotating motors as well as linear motors are relatively high power density, high efficiency, short end windings, good flux weakening capability, and easier manufacturability. Additionally, for homologous linear synchronous motors, FSCW allow for tighter packaging because the FSCW do not extend beyond the DC coil of the field windings and also allow for easier cooling of the end windings. However, there may be higher track losses and eddy current loses, and high harmonic content in back electromotive force as well as air gap flux density.

Figure 14:
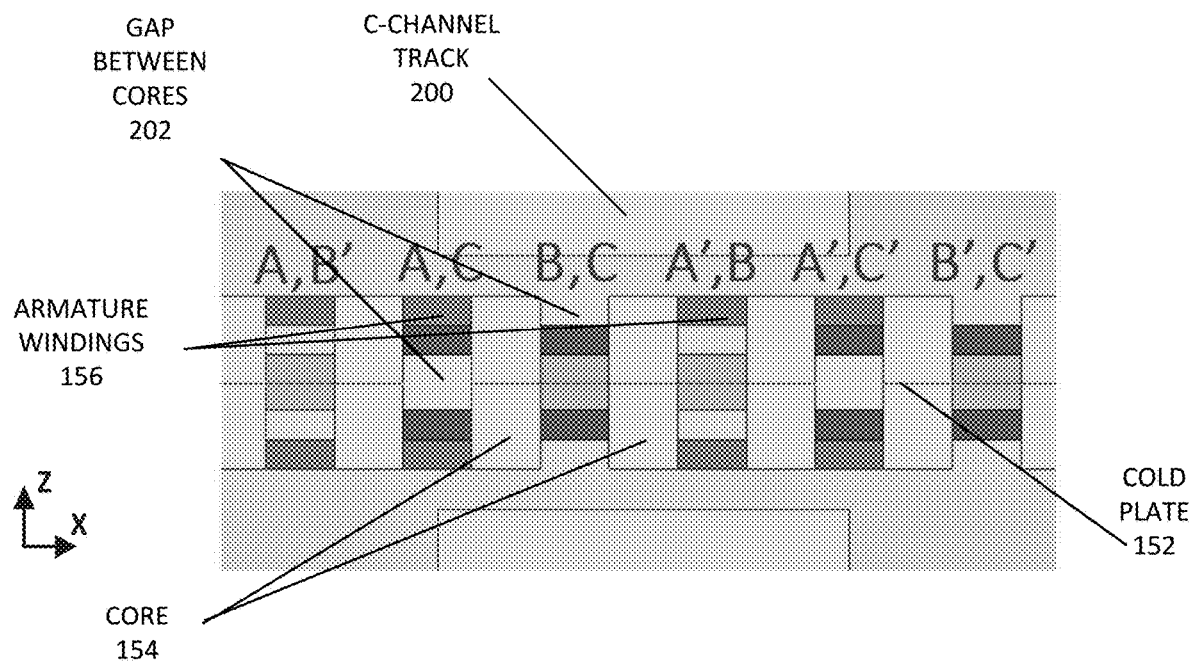
FIG. 14 shows a cross-sectional view of a 6-layer integer winding (IW) in the longitudinal x-direction and in the vertical z-direction of a yoke-less mover as one example topology of armature windings of a yoke-less mover in accordance with one embodiment.
Figure 15:
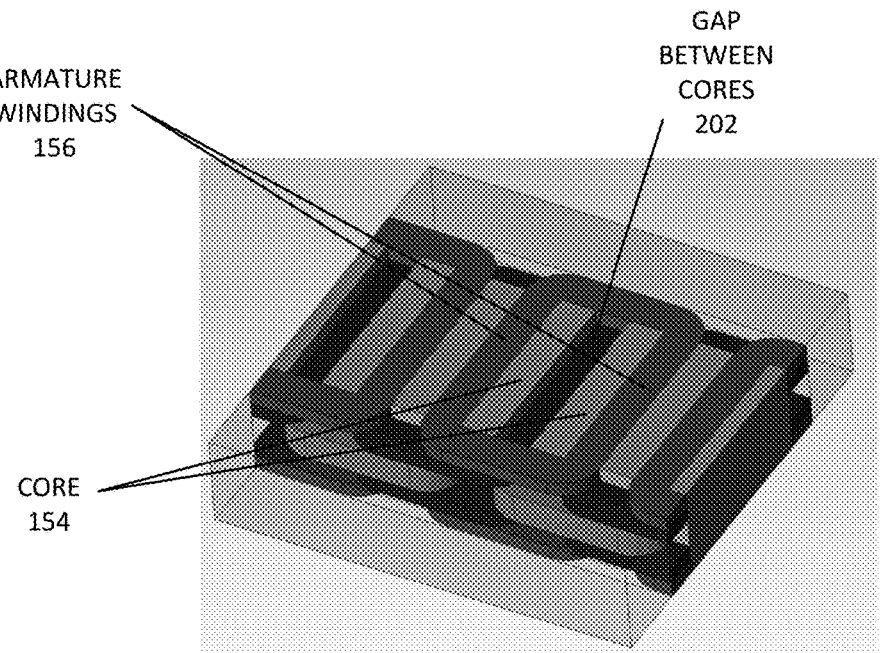
FIG. 15 shows a perspective view of the IW of the armature windings and cores of a yoke-less mover in accordance with one embodiment.

In another topology of the armature windings of the rotor provided by the cores 154 of the yoke-less mover, FIG. 14 shows a cross-sectional view of a 6-layer integer winding (IW) in the longitudinal x-direction and in the vertical z-direction. The coil of a phase of the armature windings 156 may be wound around two the cores 154 separated by a gap 202 to create a pole. The three phases of the armature windings 156 may be stacked on six layers in the z-direction of the rotor such that all armature coils of the same phase may be the same distance from a core face, and armature coils of different phases may be different distances from a core face. For example, armature coils denoted by phase A/A' are stacked on the two outermost layers of the cores 154 on either side of the cold plate 152; armature coils denoted by phase C/C' are stacked on the two inner layers next to the A/A' layers; and armature coils denoted by phase B/B' are stacked on the two innermost layers. The three phases of the armature windings 156 are also staggered so that a portion of the armature coils of phase A/A' in the outermost layers may overlap a portion of the armature coils of phase C/C' in the next layer and may also overlap a portion of the armature coils of phase B/B' in the innermost layers. The pattern of the staggered armature windings 156 for the three phases may be repeated along the cores 154 of the motor in the x-direction. FIG. 14 shows one embodiment of the IW in which the pole pitch is ⅔ of the slot width. FIG. 15 shows a perspective view of the IW of the armature windings 156 and the cores 154 from above the motor along the x-direction.

The advantages of the short-pitched 3-layer IW are lower track losses, lower asymmetry in AC inductance, less leakage flux, higher power factor, lower losses in cold plate, and lower force ripple. The short end windings also allow for tighter packaging, low losses, and easier cooling.

Figure 16:
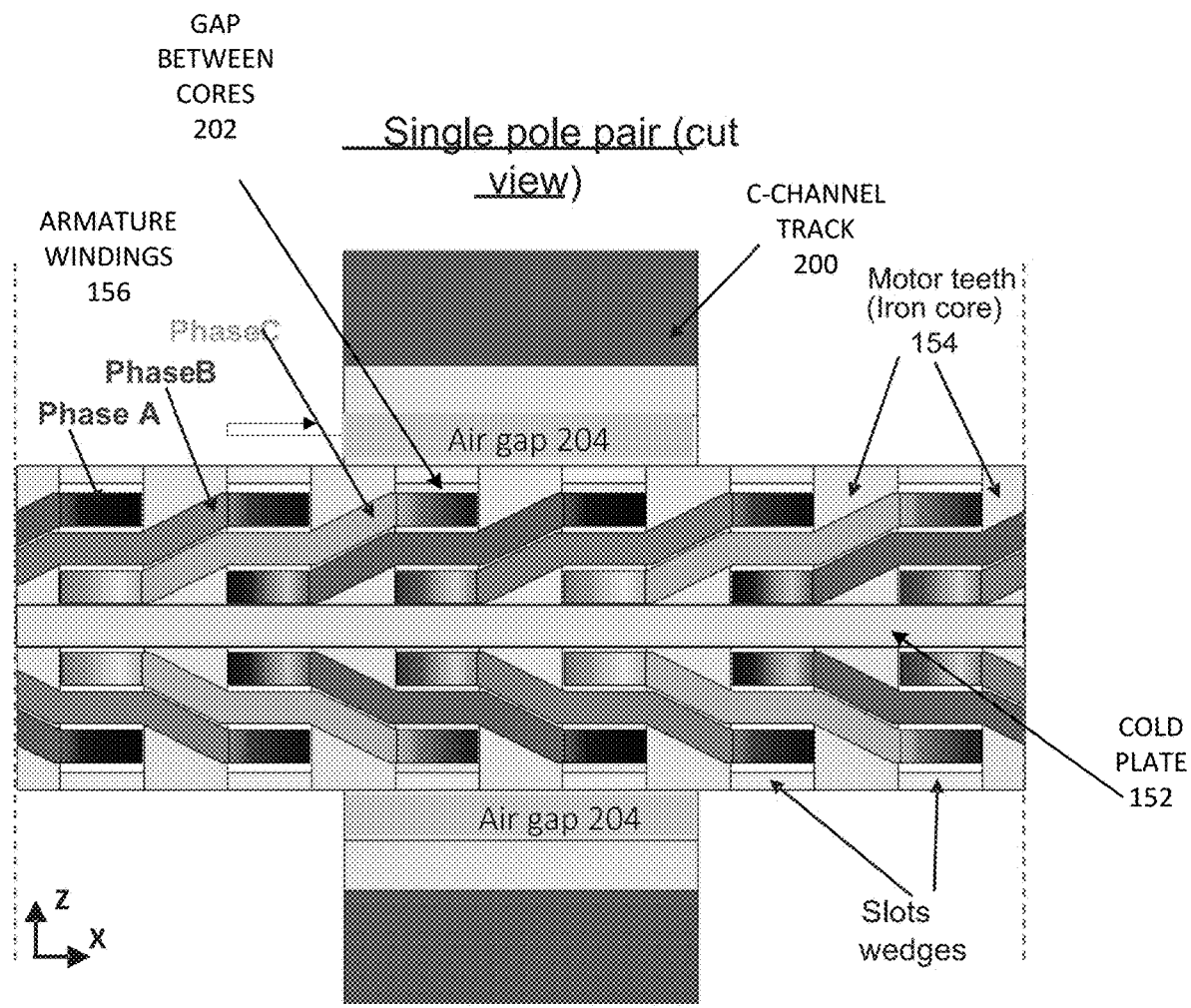
FIG. 16 shows a cross-sectional view of stepped armature windings in the longitudinal x-direction and in the vertical z-direction of a yoke-less mover as one example topology of armature windings of a yoke-less mover in accordance with one embodiment.

In another topology of the armature windings of the rotor provided by the cores 154 of the yoke-less mover, FIG. 16 shows a cross-sectional view of stepped armature windings in the longitudinal x-direction and in the vertical z-direction. The coil of a phase of the armature windings 156 may be wound around two the cores 154 separated by a gap 202 to create a pole. Similar to the 6-layer IW, the three phases of the armature windings 156 may be staggered so that a portion of the armature coils of phase A may overlap a portion of the armature coils of phase B and phase C. However, unlike the 6-layer IW in which the three phases of the armature windings 156 may be stacked to occupy respectively different layers, the three phases of the armature windings 156 all start on the same layer but are stepped to go down to successive different layers. For example, the armature windings 156 of each phase may traverse the gap 202 between the cores 154 transversally in the y-direction of the rotor along the outermost layer. The armature windings 156 may step down from the outermost layer to successive lower layers at for each successive gap 202. When the armature windings 156 reach the lowest layer next to the cold plate 152, the armature windings 156 may traverse the gap 202 transversally in the reverse of the y-direction of the traversal on the outermost layer. The pattern of the staggered and stepped armature windings 156 for the three phases may be repeated along the cores 154 of the motor in the x-direction. FIG. 14 shows one embodiment of the stepped armature windings 156 in which the pole pitch is ⅔ of the slot width.

Referring back to FIG. 2 that shows a perspective view of the stepped armature windings 156 and the cores 154 from above the motor along the x-direction. The advantages of the stepped armature windings 156 are short end windings, symmetric inductance, and elimination of second order force ripple.

While the specification describes particular embodiments of the present disclosure, the description is not intended to be exhaustive or to limit the invention to the precise forms disclosed. Many modifications and variations are possible in view of the above teachings. The embodiments were chosen and described in order to best explain the principles of the invention and its practical applications. They thereby enable others skilled in the art to best utilize the invention and various embodiments with various modifications as are suited to the particular use contemplated. Those of ordinary skill can devise variations of the present disclosure without departing from the inventive concept.

What is claimed is:

1. A machine having a moving member, the moving member comprising:
    a cold plate having one or more cooling channels formed within the cold plate;
    a plurality of armature windings, fixed to the cold plate;
    one or more field windings, fixed to the cold plate; and
    a plurality of ferromagnetic cores fixed to the cold plate, each ferromagnetic core positioned within a loop of at least one of the plurality of armature windings, wherein each of the plurality of ferromagnetic cores is positioned in a respective slot formed through the cold plate.

2. The machine of claim 1, wherein the one or more field windings is fixed to the cold plate at an outer perimeter of the cold plate.

3. The machine of claim 2, wherein the plurality of armature windings and the plurality of ferromagnetic cores are fixed to the cold plate within the outer perimeter of the cold plate, within boundary formed by the one or more field windings.

4. The machine of claim 1, wherein the cold plate is formed from a top plate and a base plate, the one or more cooling channels being formed in the base plate.

5. The machine of claim 1, wherein the cold plate includes one or more of the following: aluminum, magnesium, stainless steel, titanium.

6. The machine of claim 1, wherein the cold plate is formed from 304 stainless steel.

7. The machine of claim 1, wherein the one or more cooling channels form a loop around at least three sides of each of the slots.

8. The machine of claim 7, wherein a respective slit cuts through the cold plate from each of the slots to an edge of the cold plate, forming a paddle portion between each of the slots and the edge of the cold plate.

9. The machine of claim 8, wherein the one or more cooling channels loop through each paddle portion from one of the slots to an adjacent slot.

10. The machine of claim 1, further comprising a cooling ribbon having a cooling channel for circulating coolant, along a length of the field winding.

11. The machine of claim 1, wherein the plurality of armature coils and the one or more field windings each have at least one flat section that is in contact with the cold plate.

12. The machine of claim 1, wherein no additional structural members, other than the cold plate, are connected between the plurality of armature windings, the plurality of ferromagnetic cores, and the one or more field windings.

13. An article of manufacture having a moving member, the moving member comprising:
    a cold plate having one or more cooling channels formed within the cold plate;
    a plurality of armature windings, fixed to the cold plate;
    one or more field windings, fixed to the cold plate; and
    a plurality of ferromagnetic cores fixed to the cold plate, each ferromagnetic core positioned within a loop of at least one of the plurality of armature windings, wherein each of the plurality of ferromagnetic cores is positioned in a respective slot formed through the cold plate.

14. The article of manufacture of claim 13, wherein the one or more field windings is fixed to the cold plate at an outer perimeter of the cold plate.

15. The article of manufacture of claim 13, wherein the plurality of armature windings and the plurality of ferromagnetic cores are fixed to the cold plate within the outer perimeter of the cold plate, within boundary formed by the one or more field windings.

16. The article of manufacture of claim 13, wherein the cold plate is formed from a top plate and a base plate, the one or more cooling channels being formed in the base plate.

* * * * *